(12) United States Patent
Razzell

(10) Patent No.: US 6,975,692 B2
(45) Date of Patent: Dec. 13, 2005

(54) SCALING OF DEMODULATED DATA IN AN INTERLEAVER MEMORY

(75) Inventor: Charles Razzell, Pleasanton, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 447 days.

(21) Appl. No.: 09/729,748

(22) Filed: Dec. 4, 2000

(65) Prior Publication Data

US 2002/0067780 A1 Jun. 6, 2002

(51) Int. Cl.$^7$ ............................................. H04L 27/06
(52) U.S. Cl. ...................... 375/341; 375/262; 375/340; 375/347
(58) Field of Search ................................. 375/130, 262, 375/267, 340, 341, 347; 714/786, 794, 795

(56) References Cited

U.S. PATENT DOCUMENTS

| | | | |
|---|---|---|---|
| 5,241,563 A | 8/1993 | Paik et al. | 375/262 |
| 5,243,627 A | 9/1993 | Betts et al. | 375/222 |
| 5,535,220 A | 7/1996 | Kanno et al. | 714/701 |
| 5,619,514 A | 4/1997 | Smith | 714/795 |
| 5,943,371 A | 8/1999 | Beale et al. | 375/341 |
| 6,125,136 A | 9/2000 | Jones et al. | 375/147 |
| 6,347,124 B1 * | 2/2002 | Antia et al. | 375/341 |
| 6,424,619 B2 * | 7/2002 | Odenwalder et al. | 370/209 |
| 6,621,850 B1 * | 9/2003 | Li et al. | 375/130 |

OTHER PUBLICATIONS

Mobile Radio Communications, R. Steele, Pentech Press Limited, London, 1992, reprinted 1994, Chapter 4, pp. 347–398.

Lee, Y. K. et al., " Normalization windowing and quantization of soft–decision Viterbi decoder inputs in CDMA systems" Vehicular Technology Conference, 1999 IEEE 49$^{th}$ Houston , TX, USA May 16–20, 1999, Piscataway, NJ, USA, IEEE, US, pp. 221–225 XP010341929 ISBN: 0–7803–5565–2, p. 221–p. 222.

* cited by examiner

Primary Examiner—Chieh M. Fan
(74) Attorney, Agent, or Firm—Aaron Waxler

(57) ABSTRACT

In a method of demodulating and decoding an encoded interleaved signal, a received encoded interleaved signal is demodulated, thereby producing soft-decision demodulated output words. Thereafter, the soft-decision demodulated output words are de-interleaved and scaled, thereby producing de-interleaved and scaled words. The scaling is performed for a plurality of successively demodulated output words at a time, thereby applying a scale factor that is substantially constant over the entire span of an interleaving frame. The de-interleaved and scaled words are word-length-reduced words. Finally, the de-interleaved and scaled words are decoded.

18 Claims, 3 Drawing Sheets

SCALING OF DEMODULATED DATA IN AN INTERLEAVER MEMORY

BACKGROUND OF THE INVENTION

1. Field of the Invention

The present invention relates to a method of demodulating and decoding a received encoded interleaved signal, more particularly to de-interleaving and scaling of soft-decision demodulated output words. Such a method is particularly useful in a receiver that receives such encoded interleaved signal through a strongly fading channel. The channel can be a wireless channel carrying communication signals or broadcast signals, but also a non-wireless channel exhibiting fading of signals. The method can be used in modems, cell phone systems, digital audio broadcasting systems, digital television systems, or any other system where interleaving of source code bits is done to overcome channel shortcomings.

2. Description of the Related Art

In the U.S. Pat. No. 5,241,563, demodulation, de-interleaving and decoding of a convolutional encoded interleaved received signal is disclosed. Interleaving digital data before transmission and de-interleaving the data after reception causes bursts of channel errors to be spread out in time, and, as described, is particularly useful for strongly fading channels, or when signals arrive as multipath signals over two or more paths of different lengths. For decoding such received signals, various techniques are known, one such technique being the well-known Viterbi algorithm, which uses the trellis structure of a convolutional code. For any convolutional code, the output of the Viterbi decoder is a sequence of estimated information digits which is maximum likelihood conditioned upon the received sequence.

As disclosed in the U.S. Pat. No. 6,125,136, convolutional codes involve memory, an output code of a convolutional encoder being a sequence of n bits generated for every input of k source digits, a ratio k/n being the code rate. For convolutional codes, the optimum decoding process amounts to finding the single path through the code trellis that most nearly represents the demodulated bit sequence. The transmitted code digits correspond to a specific path through the trellis. The receiver determines the most likely path that corresponds to the received sequence and then uses this path to specify the decoded data sequence that would have generated the path. As described in U.S. Pat. No. 6,125,136, a system that uses such trellis coded signals is a direct sequence spread spectrum communication system, e.g. a CDMA system that has been adopted as a standard in North America. In such CDMA systems signals are received that are transmitted on strongly fading channels, typically as a multi-path received signal.

In such CDMA systems, one type of receiver that is used is the well-known so-called rake receiver that ratio combines rays of a multi-path received signal. The rake receiver, or any other type of suitable receiver, produces soft-decision demodulated output words that, after de-interleaving, are provided to a Viterbi decoder so as to obtain decoded data.

Furthermore, soft decision scaling and quantization methods in digital receivers are known that reduce the amount of memory and the complexity of the arithmetic in the receiver, as part of the Viterbi forward error correction algorithm. In order to do that, an estimate of the signal power is used to apply appropriate scaling and so bits can be discarded without excessive overflow (clipping) or underflow (accidental insertion of erasures). Known methods of scaling include application of a fixed scaling factor, and buffering of an entire frame of data and mapping the mean to a chosen point within the dynamic range of the word size or length of the soft-decision demodulated output words. Application of a fixed scaling factor is prone to loss of information due to underflow and overflow. Mapping the mean to a chosen point is extremely memory intensive.

The handbook "Mobile Radio Communications", R. Steele, Pentech Press Limited, London, 1992, reprinted 1994, in Chapter 4, pp. 347–398 describes channel coding, interleaving techniques, convolutional codes and the Viterbi algorithm. More particularly, on pages 350–353 block de-interleaving is described that uses a de-interleaving memory. In one block de-interleaver, at the receiver, the de-interleaver feeds the de-interleaving memory in one column at a time until the de-interleaving memory is filled and removes the symbols a row at a time, the inverse permutation of the interleaving memory at the side of the transmitter. In another block de-interleaver, the symbols are written a row at a time. In the one block interleaver/de-interleaver, interleaving adds considerable delay. In the other block interleaver/de-interleaver, the interleaver delay is negligible, end-to-end delay mainly being due to the de-interleaver.

SUMMARY OF THE INVENTION

It is an object of the invention to provide a method of demodulating and decoding an encoded interleaved signal that achieves optimal adaptation of decoding to demodulation.

It is another object of the invention to provide such a method wherein scaling of soft-decision demodulated output words and de-interleaving is done with reduced memory usage.

It is still another object of the invention to provide such a method in which such scaling is done taking into account input word and processing needs of the decoder.

In accordance with the invention, a method of demodulating and decoding an encoded interleaved signal is provided, said method comprising:

demodulating a received encoded interleaved signal thereby producing soft-decision demodulated output words;

de-interleaving and scaling said soft-decision demodulated output words thereby producing de-interleaved and scaled words, said scaling being performed for a plurality of successively demodulated output words at a time, thereby applying scaling factors that have substantially the same value for adjacent demodulated output words of said plurality of successively demodulated output words, said de-interleaved and scaled words being word-length-reduced words; and decoding said de-interleaved and scaled words.

In an advantageous embodiment, a de-interleaving memory is filled with the word-length-reduced soft-decision demodulated output words. While the de-interleaving memory is being filled, overflow or underflow of the word-length-reduced words is checked and a scaling factor is adjusted accordingly. In case of underflow, the scaling factor is increased. In case of overflow, the scaling factor is decreased.

Advantageously, memory locations where scale factors were changed during the filling of the interleaving memory are recorded, along with the modified scaling factor applied, and, after filling of the interleaving memory, through in-place normalization of the entire interleaving memory a uniform scaling is determined. Such a normalization in-place, that avoids using additional memory, is particularly advantageous when decoding is done using a Viterbi algorithm. It also avoids using information from a previous frame to adjust the scale factor of the current frame which may lead to accidental erasures or overflow conditions. The use of a uniform scaling factor is important because the Viterbi algorithm performs better when receiving properly scaled successive input words, i.e., where the scaling of soft decisions is at least uniform over the length of the employed traceback memory. The reordering of bits in the de-interleaver widens the scope of this constraint such that a safe policy is to keep the scale factor uniform over the entire interleaving frame.

Once the de-interleaver memory has been filled and uniform scaling has been applied, a de-interleaving operation is performed. Such a de-interleaving operation is known per se.

In an alternative embodiment, the scaling is done in a de-interleaving memory and determination of the scaling factors is done through digital low pass filtering while writing the plurality of successively demodulated and word-length-reduced output words into the de-interleaving memory. In such a scheme, the output of the low pass filter is subject to a sample and hold block so that the scale factor is only allowed to change at the boundary of interleaver frames.

In case the receiver is a spread spectrum CDMA receiver for use in a wireless communication system, preferably the receiver has a demodulator of a type that combines rays in a multi-path received signal using Maximum Ratio Combining. Such a demodulator can be a rake receiver, or any other suitable ratio combining demodulator.

In case of maximum likelihood decoding such as Viterbi decoding, the demodulator should preferably provide soft-decision demodulated output words that are log-likelihood ratios. With log-likelihood ratio input, the Viterbi algorithm only needs to perform summing operations such as the summing of path metrics in the trellis. Herewith it is avoided that the Viterbi algorithm needs to perform multiplication operations. Such multiplication operations demand more processing capacity and are more memory intensive that summing operations. The Viterbi decoder expects convolutional encoded input words.

BRIEF DESCRIPTION OF THE DRAWING

Throughout the figures the same reference numerals are used for the same features.

DESCRIPTION OF THE DETAILED EMBODIMENTS

Figure 1:
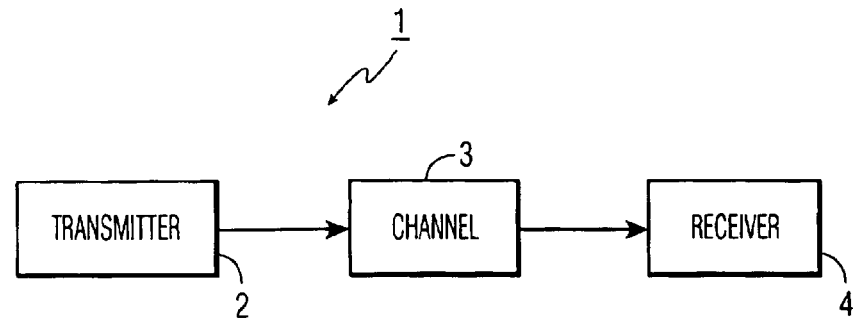
FIG. 1 schematically shows a system with a transmitter, a channel, and a receiver.

FIG. 1 schematically shows a system 1 with a transmitter 2, a channel 3, and a receiver 4. The channel is a bursty error channel. In the transmitter 2, encoding and interleaving is applied. In the receiver 4, de-interleaving and decoding is applied. Interleaving is a process of rearranging the ordering of a sequence of binary or non-binary symbols in some unique one-to-one deterministic manner. The reverse of this process is the de-interleaving which is to the sequence of its original ordering. In one example, the system is a cellular radio system such as a North American standardized CDMA system. The system may be any wireless or wired system in which interleaving is applied to overcome the bursty error character of the channel.

Figure 2:
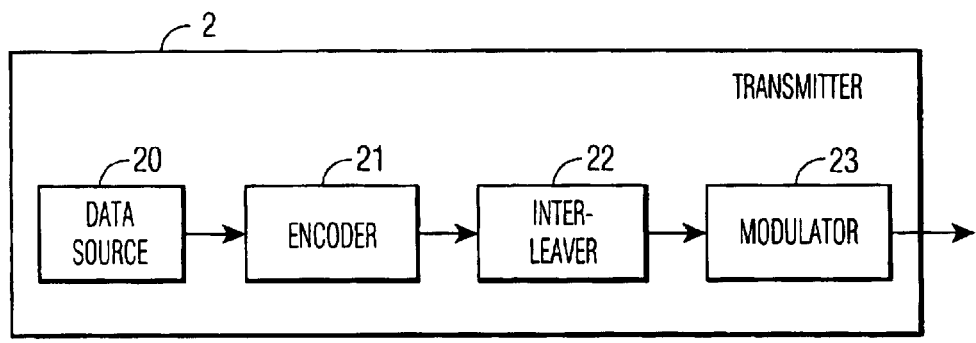
FIG. 2 shows a block diagram of a transmitter.

FIG. 2 shows a block diagram of the transmitter 2. In the transmitter 2, a data source 20 provides data to an encoder 21. After interleaving of encoded data in an interleaver 22, a modulator 23 transmits a modulated encoded interleaved signal to the receiver 4 via the channel 3. The encoder 21 may provide a convolutional code. The receiver 4 may apply convolutional decoding, through a Viterbi algorithm, for instance.

Figure 3:
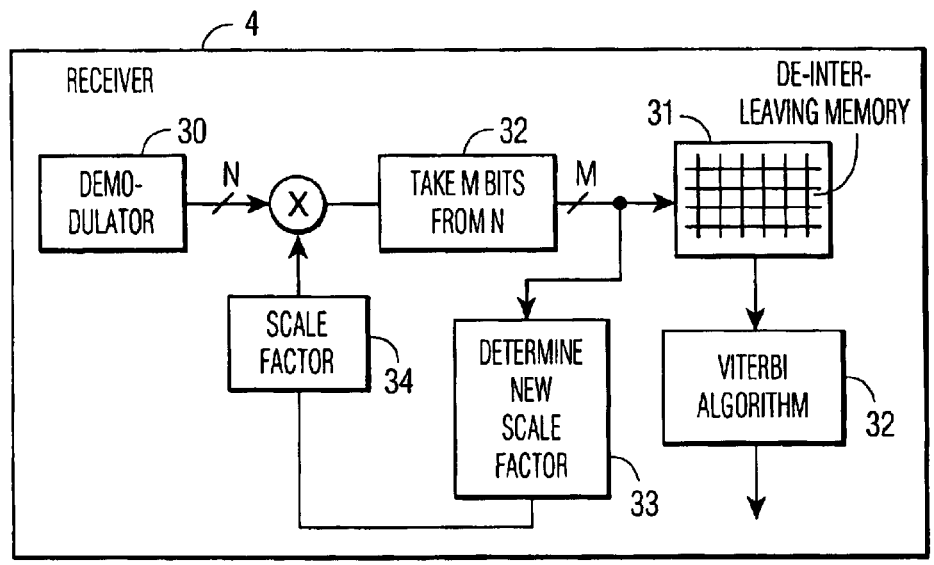
FIG. 3 shows a receiver according to the invention.

FIG. 3 shows a mixed hardware/software block diagram of the receiver according 4 to the invention. For performing software functions, such a receiver has a processor with ROM and RAM (not shown in detail here), as will be readily recognized in the art. The receiver 4 has a demodulator 30 that produces soft-decision demodulated output words of N bits, N being an integer. The receiver 4 further has a de-interleaving memory 31 that is filled with a plurality of successively demodulated output words at a time, until it is full. The demodulated output words are written in successive columns of the de-interleaving memory 31. Upon completion of writing and scaling, a de-interleaving operation is performed and de-interleaved scaled input words are provided, a row at a time, to a decoder 32, in the example given a Viterbi decoder. The demodulator 30 may include a rake receiver that provides maximum likelihood ratios. The de-interleaver, formed by the de-interleaving memory 31 and a processor, may have any other suitable hardware and/or software structure. Upon writing of the soft-decision demodulated output words into the de-interleaving memory 31, the word length of the words is reduced from N to M bits, in operation 32 where the most significant bits are taken from the N bit words. This is because the Viterbi algorithm does not need N bit accuracy, and to save memory. In block 33, from the M bit reduced words, a new scale factor is determined for each of the soft-decision demodulated output words being written into the de-interleaving memory 31, and the new scale factor is stored in block 34.

Figure 4:
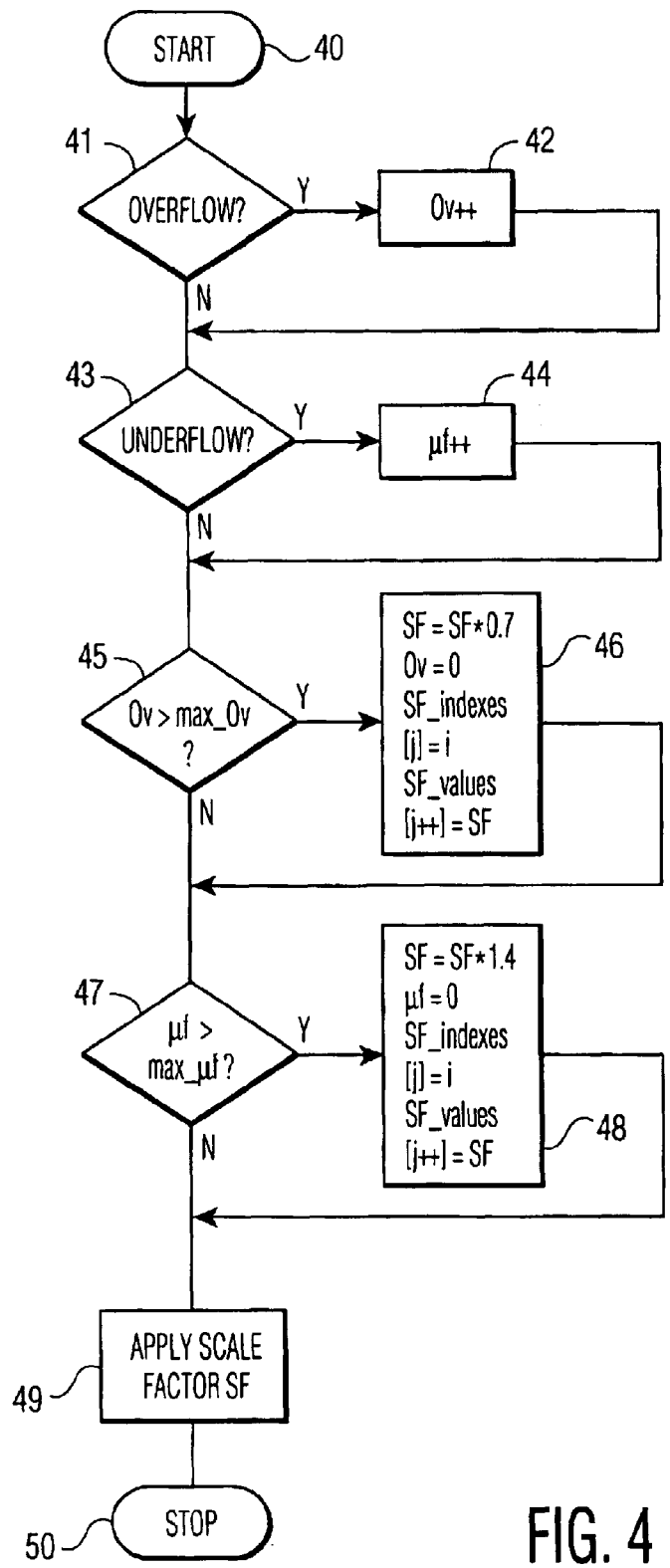
FIG. 4 is a flowchart illustrating a first embodiment of determining scale factors according to the invention.

FIG. 4 is a flowchart illustrating a first embodiment of determining scale factors according to the invention. First, scale factors are determined for each reduced word being written into the de-interleaving memory 31. Shown is determination of a new scale factor for the i-th soft-decision, i being a running variable spanning the entire de-interleaving memory 31. An initial scale factor SF may be determined from previous frames or may be an initial guess or otherwise. The process starts in block 40. In block 41 it is checked whether an overflow situation exits, overflow being monitored by an overflow counter Ov. In case of overflow, the overflow counter Ov is incremented, indicated by Ov++, in block 42. In block 43 it is checked whether an underflow situation exits, underflow being monitored by an underflow counter Uf. In case of overflow, the underflow counter Uf is incremented, indicated by Uf++, in block 44. If no overflow or underflow situation exits, there is no need to adapt the scale factor SF. In block 45, it is checked whether the overflow counter Ov exceeds a given threshold max_Ov. If so, in block 46, a new scale factor is determined as SF=SF*0.7, the overflow counter Ov is reset, Ov=0, the index i for which overflow occurred is recorded in an array SF_indexes [j], j being an array index, as SF_indexes [j]=i, and the corresponding newly determined scaling factor SF is recorded in an array SF_values [j++], j++ being an array index, as SF_values [j++]=SF. Multiplication factor 0.7 corresponds to a 3 dB decrease. Other reduction factors may be applied. Similarly, in block 47, it is checked whether the underflow counter Uf exceeds a given threshold max_Uf, and, if so, the scaling factor SF is increased to SF=SF*1.4, Uf=0, SF_indexes [j]=i, and SF_values [j++]=SF. Thereafter, in block 49, new scale factor SF is applied for index i. For a persisting overflow situation, when receiving a very high level signal that has a clipping effect, the scale factor will be decreased for a succession of words. For, example, for ten successive overflows it might then take twenty words for the scale factor to get back to an earlier, higher, value. Similar holds for a persisting underflow situation. In the embodiment wherein a uniform scaling factor is determined for the entire de-interleaving memory 31, after filling and initial scaling of the entire de-interleaving memory 31, the information recorded in arrays SF_indexes [j], i.e., locations of adapted scale factors, and SF_values [j++], i.e., the correspondingly adapted scale factors is used. Particularly when applying a Viterbi decoder, such clean-up is highly desired. Thus, from the recorded information a good overall scaling factor is determined for the entire de-interleaving memory 31. From the arrays it is known where, i.e., at what indexes i, the scale factor SF had been adapted, and also, from that index i, how many times the adapted scale factor was applied before again being adapted. So, the overall scale factor could be computed as the sum of products of occurrences of given scale factors and the correspondingly recorded scaling factor, divided by the length of the de-interleaving memory 31. After determination of the overall scaling factor, the de-interleaving memory 31 is re-written, for each position where an adapted scaling factor was applied, thereby re-scaling a stored reduced word with a normalized scaling factor, the determined overall scaling factor divided by the previously applied scaling factor.

Figure 5:
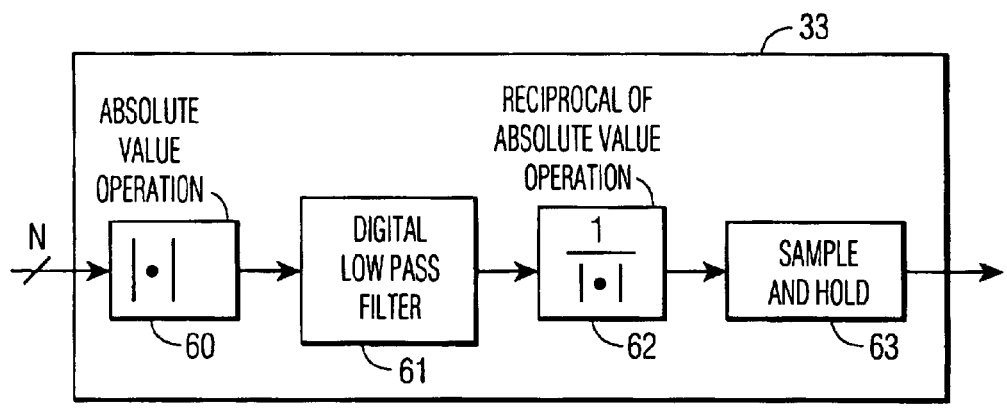
FIG. 5 shows a second embodiment of determining scale factors according to the invention.

FIG. 5 shows a second embodiment of determining scale factors according to the invention. To determine new scaling factors, full length words of length N are subject to an absolute value operation 60 (|.|) and then applied to a digital low pass filter 61. In block 62, output words of the digital low pass filter 61 are subjected to a reciprocal operation of the absolute value operation. The digital low pass filter 61 can be a first order IIR-filter (Infinite Impulse Response), operating on substantially an entire interleaving frame of soft bits. In this case, a sample and hold block 63 must be used to prevent the applied scale factor from changing during an interleaving frame. Alternatively, it can be a sum and dump operation operating over the entire length of an interleaving frame. In either case, this results in amplitude data from one frame being used to derive a scaling factor for the next frame.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A method of demodulating and decoding an encoded interleaved signal, said method comprising:
    demodulating a received encoded interleaved signal thereby producing soft-decision demodulated output words, wherein intermediate scaling factors are applied to a plurality of successively demodulated output words;
    de-interleaving and scaling said soft-decision demodulated output words thereby producing de-interleaved and scaled words, said scaling being performed for said plurality of successively demodulated output words at a time, thereby applying scaling factors, determined from said intermediate scaling factors, that have substantially the same value for adjacent demodulated output words of said plurality of successively demodulated output words, said de-interleaved and scaled words being word-length-reduced words; and
    decoding said de-interleaved and scaled words.

2. A method as claimed in claim 1, wherein the determining of said scaling factors from said intermediate scaling factors achieves a uniform scaling factor for said plurality of successively demodulated output words.

3. A method as claimed in claim 1, therein performing said scaling in a de-interleaving memory, the application of said intermediate scaling factors being done while writing said plurality of successively demodulated output words into said de-interleaving memory, and the determining of said scaling factors from said intermediate scaling factors being done in-place in said de-interleaving memory.

4. A method as claimed in claim 1, therein increasing a previously determined intermediate scaling factor for a current demodulated output word if said current demodulated output word exhibits a predetermined number of underflows.

5. A method as claimed in claim 1, therein decreasing a previously determined intermediate scaling factor for a current demodulated output word if said current demodulated output word exhibits a predetermined number of overflows.

6. A method as claimed in claim 1, therein performing said scaling in a de-interleaving memory and determining said scaling factors through digital low pass filtering while writing said plurality of successively demodulated output words into said de-interleaving memory.

7. A method as claimed in claim 1, therein demodulating said received encoded interleaved signal with a rake receiver.

8. A method as claimed in claim 1, wherein said soft-decision demodulated output words are log-likelihood ratios, and said decoding is maximum likelihood decoding.

9. A method as claimed in claim 8, therein performing said maximum likelihood decoding through a Viterbi algorithm.

10. A method as claimed in claim 1, wherein said received encoded interleaved signal is convolutional encoded.

11. A receiver for receiving an encoded interleaved signal, said receiver comprising:
    a demodulator for demodulating the received encoded interleaved signal, said demodulator producing soft-decision demodulated output words, wherein intermediate scaling factors are applied to a plurality of successively demodulated output words;
    a de-interleaving and scaling memory for de-interleaving and scaling of said soft-decision demodulated output words, said receiver being configured to produce de-interleaved and scaled words in said de-interleaving and scaling memory for said plurality of successively demodulated output words at a time, thereby applying scaling factors, determined from said intermediate scaling factors, that have substantially the same value for adjacent demodulated output words of said plurality of successively demodulated output words, said de-interleaved and scaled words being word-length-reduced words; and
    a decoder for decoding said de-interleaved and scaled words.

12. A receiver as claimed in claim 11, said receiver being configured to apply said intermediate scaling factors while writing said plurality of successively demodulated output words into said de-interleaving and scaling memory, and to do the determination of said scaling factors from said intermediate scaling factors in-place in said de-interleaving and scaling memory.

13. A receiver as claimed in claim 11, said receiver being configured to increase a previously determined intermediate scaling factor for a current demodulated output word if said current demodulated output word exhibits a predetermined number of underflows.

14. A receiver as claimed in claim 11, said receiver being configured to decrease a previously determined intermediate scaling factor for a current demodulated output word if said current demodulated output word exhibits a predetermined number of overflows.

15. A receiver as claimed in claim 11, said receiver being configured to achieve a uniform scaling factor for said plurality of successively demodulated output words when determining of said scaling factors from said intermediate scaling factors.

16. A receiver as claimed in claim 11, further comprising a digital low pass filter, said receiver being configured to determine said scaling factors through digital low pass filtering of said soft-decision demodulated output words with said digital low pass filter while writing said plurality of successively demodulated output words into said de-interleaving and scaling memory.

17. A receiver as claimed in claim 11, wherein said demodulator is a rake receiver.

18. A receiver as claimed in claim 11, wherein said decoder is a Viterbi-decoder.

* * * * *

UNITED STATES PATENT AND TRADEMARK OFFICE
CERTIFICATE OF CORRECTION

PATENT NO. : 6,975,692 B2
APPLICATION NO. : 09/729748
DATED : December 13, 2005
INVENTOR(S) : Razzell It is certified that error appears in the above-identified patent and that said Letters Patent is hereby corrected as shown below:

In The Specification

In Column 3, Line 47, delete "DRAWING" and insert -- DRAWINGS --, therefor.

In Column 3, Line 59, delete "DESCRIPTION OF THE DETAILED" and insert -- DETAILED DESCRIPTION OF THE --, therefor.

In Column 4, Line 17, delete "receiver according 4" and insert -- receiver 4 according --, therefor.

In Column 4, Line 58, delete "Uf." and insert -- µf. --, therefor.

In Column 4, Line 58, delete "Uf and insert -- µf --, therefor.

In Column 4, Line 59, delete "Uf++," and insert -- µf++, --, therefor

In Column 5, Line 5, delete "Uf exceeds a given threshold max_Uf," and insert -- µf exceeds a given threshold max_µf, --, therefor.

In Column 5, Line 7, delete "Uf=0," and insert -- µf=0, --, therefor.

Signed and Sealed this
Fourteenth Day of June, 2016

Michelle K. Lee
*Director of the United States Patent and Trademark Office*